(12) United States Patent
Suzuki et al.

(10) Patent No.: US 11,705,344 B2
(45) Date of Patent: Jul. 18, 2023

(54) METHOD OF MANUFACTURING A RESIN-SEALED SEMICONDUCTOR DEVICE

(71) Applicant: RENESAS ELECTRONICS CORPORATION, Tokyo (JP)

(72) Inventors: Masakatsu Suzuki, Tokyo (JP); Haruhiko Harada, Tokyo (JP); Yasuhiko Akaike, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 66 days.

(21) Appl. No.: 17/405,550

(22) Filed: Aug. 18, 2021

(65) Prior Publication Data

US 2022/0068668 A1    Mar. 3, 2022

(30) Foreign Application Priority Data

Sep. 3, 2020  (JP) ................. 2020-148587

(51) Int. Cl.
*H01L 21/56*  (2006.01)
*H01L 21/02*  (2006.01)

(52) U.S. Cl.
CPC ...... *H01L 21/565* (2013.01); *H01L 21/02041* (2013.01); *H01L 2924/181* (2013.01)

(58) Field of Classification Search
CPC .............. H01L 21/565; H01L 21/02041

USPC ........................................ 438/126
See application file for complete search history.

(56) References Cited

U.S. PATENT DOCUMENTS

2011/0168761 A1\*  7/2011  Hwang ............... H01L 24/75
                                                    228/13
2020/0144075 A1\*  5/2020  Akaike ............... H01L 24/83

FOREIGN PATENT DOCUMENTS

JP    2020-004857 A    1/2020

\* cited by examiner

*Primary Examiner* — Kimberly N Rizkallah
*Assistant Examiner* — Dilinh P Nguyen
(74) *Attorney, Agent, or Firm* — McDermott Will & Emery LLP

(57) ABSTRACT

A technique capable of shortening process time for plasma cleaning is provided. A method of manufacturing a semiconductor device includes a step of preparing a substrate including a plurality of device regions each including a semiconductor chip electrically connected to a plurality of terminals formed on a main surface by a wire, a step of delivering the substrate while emitting plasma generated in atmospheric pressure to the main surface of the substrate, a step of delivering the substrate while capturing an image of a region of the main surface of the substrate and a step of forming a sealing body by sealing the semiconductor chip and the wire with a resin.

10 Claims, 12 Drawing Sheets

METHOD OF MANUFACTURING A RESIN-SEALED SEMICONDUCTOR DEVICE

CROSS-REFERENCE TO RELATED APPLICATION

The disclosure of Japanese Patent Application No. 2020-148587 filed on Sep. 3, 2020, including the specification, drawings and abstract is incorporated herein by reference in its entirety.

BACKGROUND

The present disclosure relates to a method of manufacturing a semiconductor device, and is applicable to, for example, a method of manufacturing a packaged semiconductor device by sealing a semiconductor chip with a resin.

A semiconductor chip is mounted on a chip mounting region of a substrate such as a wiring board, a pad electrode of the semiconductor chip and a terminal of the substrate are electrically connected to each other by a wire, and these components are sealed with a resin, so that a semiconductor device in a semiconductor package form is manufactured.

There are disclosed techniques listed below.

[Patent Document 1] Japanese Unexamined Patent Application Publication No. 2020-4857

SUMMARY

In a resin-sealed semiconductor device, improvement of production efficiency is desirable.

Other objects and novel characteristics will be apparent from the description of the present specification and the accompanying drawings.

The summary of the typical aspects in the present disclosure will be briefly described as follows. In other words, the method of manufacturing the semiconductor device includes: a step of preparing a substrate including a plurality of device regions each including a semiconductor chip electrically connected to a plurality of terminals formed on a main surface by a wire; a step of delivering the substrate and emitting plasma generated in atmospheric pressure to the main surface of the substrate; a step of delivering the substrate and capturing an image of the main surface of the substrate; and a step of forming a sealing body by sealing the semiconductor chip and the wire with a resin.

According to the method of manufacturing the semiconductor device, the production efficiency of the semiconductor device can be improved.

BRIEF DESCRIPTIONS OF THE DRAWINGS

DETAILED DESCRIPTION

Hereinafter, embodiments will be described with reference to the accompanying drawings. Note that the same components are denoted by the same reference symbols in the following explanation, and the repetitive description thereof will be omitted. In order to make the explanation clear, a width, a thickness, a shape, and others of each portion are illustrated to be more schematic than those in an actual aspect in some cases. However, the illustration is only an example, and does not limit the interpretation of the present disclosure.

[Semiconductor Device]

Figure 1:
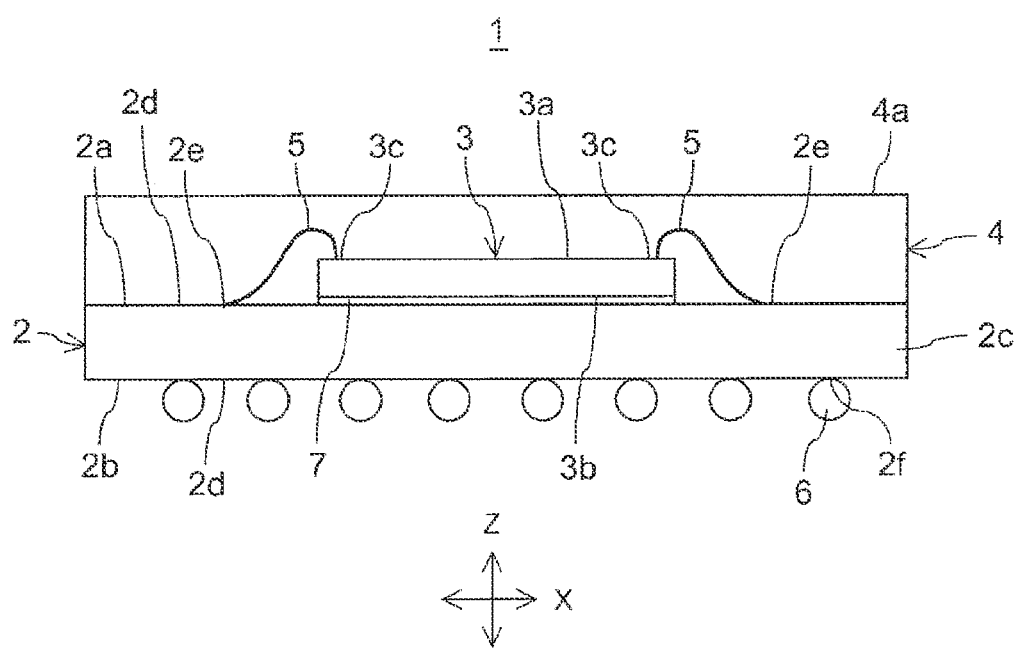
FIG. 1 is a schematic cross-sectional view of a semiconductor device according to an embodiment.

First, a configuration example of the semiconductor device will be explained with reference to FIG. 1. FIG. 1 is a schematic cross-sectional view of the semiconductor device according to an embodiment.

The semiconductor device 1 according to the embodiment is formed to be rectangular in a planar view. As shown in FIG. 1, the semiconductor device 1 includes a substrate 2, a semiconductor chip 3 mounted on the substrate 2, and a sealing body 4 sealing the semiconductor chip 3. The semiconductor chip 3 is connected to the substrate 2 by a wire 5. The sealing body 4 is formed on an upper surface 2a serving as a main surface of the substrate 2 so as to cover the entire upper surface 2a. The sealing body 4 covers the entire semiconductor chip 3 and a plurality of entire wires 5.

The substrate 2 includes a solder resist film 2d covering a base member 2c. The base member 2c is made of, for example, a prepreg that is a glass fiber soaked with a resin. The solder resist film 2d is an insulating film for preventing the plurality of wirings from being short-circuited or disconnected from one another. The solder resist film 2d is formed on each of the upper surface 2a that is the uppermost surface of the substrate 2 and a lower surface 2b that is the lowermost surface of the same.

The substrate 2 includes a wiring layer having a plurality of conductor patterns including a plurality of terminals 2e formed on the upper surface 2a. Each of the plurality of terminals 2e on the upper surface 2a of the substrate 2 are exposed from the solder resist film 2d. The substrate 2 includes a wiring layer having a conductor pattern including a plurality of lands 2f formed on the lower surface 2b. Each of the plurality of lands 2f on the lower surface 2b of the substrate 2 is exposed from the solder resist film 2d.

The plurality of terminals 2e are electrically connected to the plurality of lands 2f by a plurality of via wirings (not illustrated) penetrating the substrate 2 in its thickness direction (a "Z" direction of FIG. 1).

The plurality of lands 2f are connected to a plurality of solder balls 6, respectively. The lands 2f and the solder balls 6 are external electrodes for use in electrically connecting the semiconductor device 1 and a mounting board such as a motherboard.

Each of the upper surface 2a and the lower surface 2b of the substrate 2 is formed to be rectangular. The semiconductor chip 3 is mounted on the upper surface 2a of the substrate 2. The semiconductor chip 3 has a rectangular shape along an outer shape of the substrate 2 in a planar view, and is arranged at, for example, a substantially center (center portion) of the upper surface 2a. On the upper surface 2a, the plurality of terminals 2e are formed in a periphery of the semiconductor chip 3. The plurality of terminals 2e are bonding pads for use in electrically connecting the wire 5 and the substrate 2, and are made of, for example, metal such as copper (Cu). The plurality of terminals 2e are arranged along each side of the semiconductor chip 3.

Next, the semiconductor chip 3 mounted on the substrate 2 will be explained. A plurality of pads 3c are formed on a front surface 3a of the semiconductor chip 3. Each of the plurality of pads 3c is arranged on an edge of the front surface 3a along each side of the semiconductor chip 3.

A plurality of semiconductor elements such as a diode or a transistor are formed between the front surface 3a and a back surface 3b of the semiconductor chip 3, and are electrically connected to the plurality of pads 3c by not-illustrated wirings formed on the semiconductor element, respectively. In this manner, in the semiconductor chip 3, an integrated circuit is made of the plurality of semiconductor elements formed on the semiconductor substrate and the wirings electrically connecting the plurality of semiconductor elements.

Note that the semiconductor substrate configuring the semiconductor chip 3 is made of, for example, silicon (Si). A passivation film (not illustrated) that is an insulating film is formed on the front surface 3a that is the outermost surface of the semiconductor chip 3. Each surface of the plurality of pads 3c at an opening in this passivation film is exposed from the passivation film.

This pad 3c is made of a metal, and is made of, for example, aluminum (Al) in the present embodiment. Further, a metal film such as a gold (Au) film or a stack film made of them may be formed on the surface of this pad 3c through a nickel (Ni) film.

In the present embodiment, the semiconductor chip 3 is mounted on the substrate 2 by so-called faceup mounting method of making its back surface 3b and the upper surface 2a of the substrate 2 face each other. The semiconductor chip 3 is fixed to a chip mounting region 21a (see FIG. 3 described later) on the upper surface 2a by a bonding material 7. The bonding material 7 is not particularly limited as long as strongly fixing the semiconductor chip 3 onto the upper surface 2a of the substrate 2. However, in the present embodiment, for example, a mold bonding material containing an epoxy-based thermal hardening resin is used.

The semiconductor chip 3 is electrically connected to the substrate 2 by each of the plurality of wires 5. More specifically, one end of the wire 5 is connected to the pad 3c on the front surface 3a of the semiconductor chip 3, and the other end of the same is connected to the terminal 2e of the substrate 2. The wire 5 is made of, for example, a metal material such as gold (Au) or copper (Cu).

Next, the sealing body 4 sealing the semiconductor chip 3, the plurality of wires 5 and the plurality of terminals 2e will be explained. An upper surface 4a of the sealing body 4 is formed to be rectangular. Although described in detail later, the semiconductor device 1 is manufactured by a method of forming the sealing body first so as to collectively cover the plurality of device regions, and then, collectively cutting the sealing body and the substrate. In this method, a side surface of the sealing body 4 and a side surface of the substrate 2 are formed so as to continuously communicate with each other.

The sealing body 4 is an insulating resin body containing a lot of filler particles such as the thermal hardening resin such as the epoxy resin, a stiffener, silica and others, as main components. And, carbon particles are mixed as a colorant with the sealing body 4. The sealing body 4 is hardened while closely adhering to the semiconductor chip 3 and the plurality of wires 5 arranged inside the package. In other words, the sealing body 4 has a function of protecting the semiconductor chip 3 and the plurality of wires 5.

[Method of Manufacturing Semiconductor Device]

Figure 2:
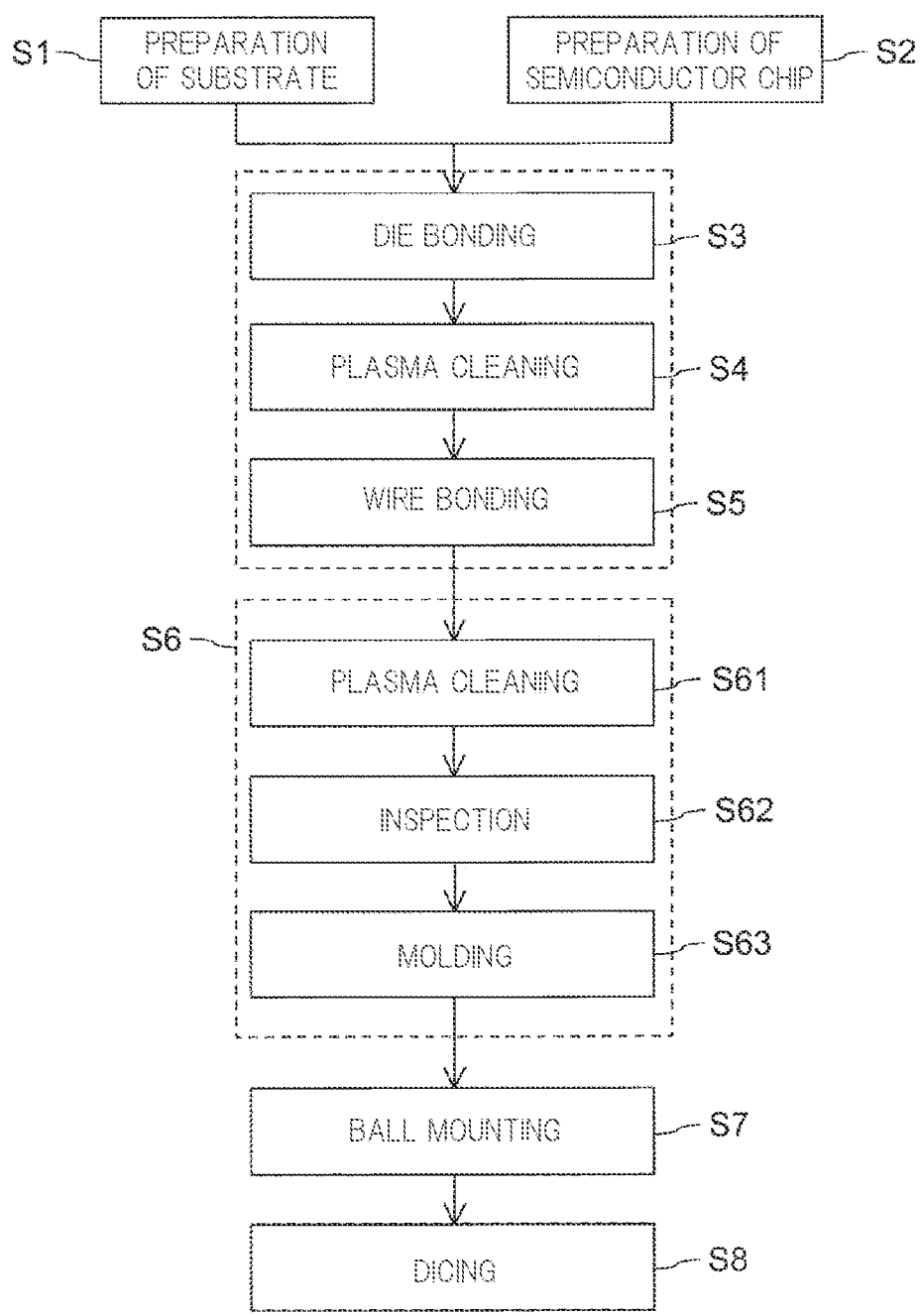
FIG. 2 is an explanatory diagram showing a flow of a step of assembling the semiconductor device explained with reference to FIG. 1.

Next, a method of manufacturing the semiconductor device 1 explained with reference to FIG. 1 will be explained with reference to FIG. 2. FIG. 2 is an explanatory diagram showing a flow of a step of assembling the semiconductor device 1 explained with reference to FIG. 1.

(Substrate Preparing Step S1, Semiconductor-Chip Preparing Step S2)

Figure 3:
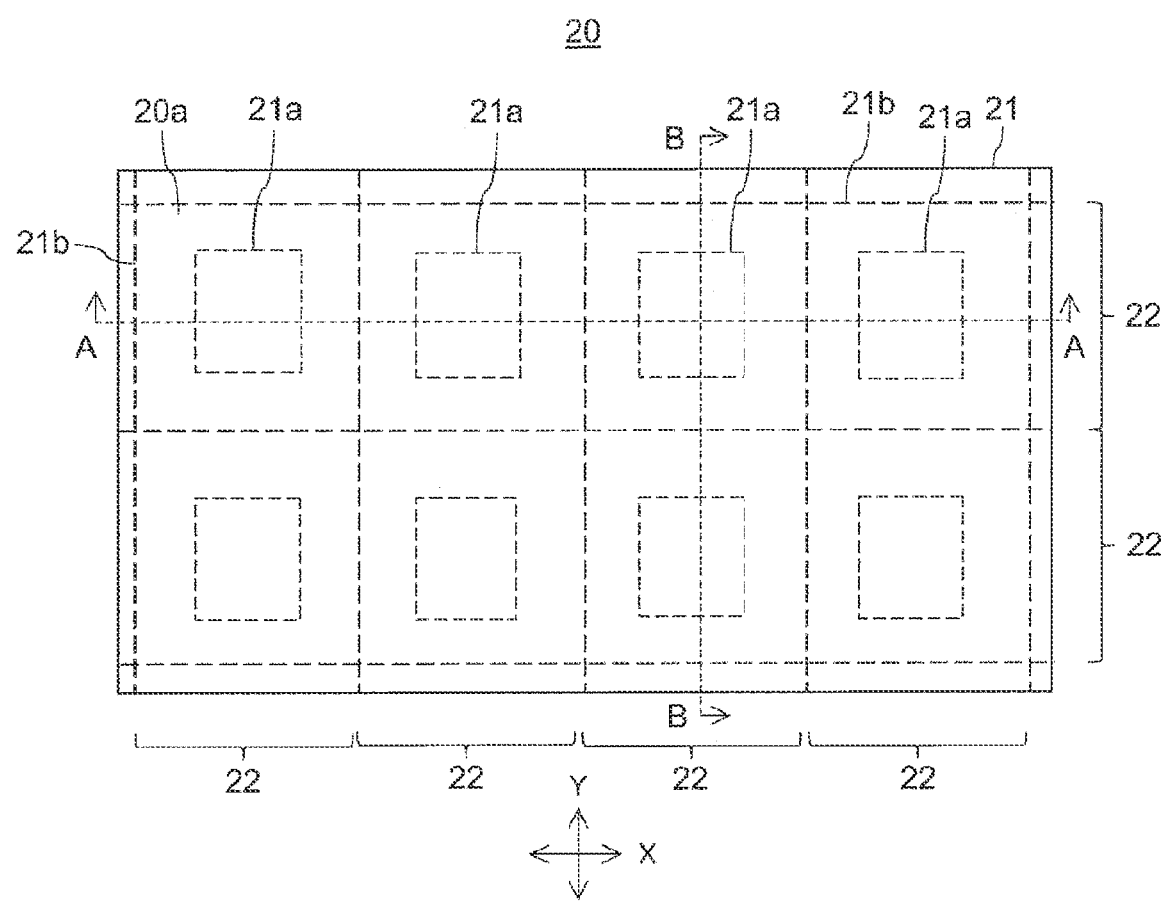
FIG. 3 is a plan view showing a schematic structure of a substrate prepared in a substrate preparing step shown in FIG. 2.

In order to manufacture the semiconductor device 1, the substrate 20 as shown in FIG. 3 is prepared first in a substrate preparing step "S1". In a semiconductor-chip preparing step "S2", the semiconductor chip 3 is prepared. FIG. 3 is a plan view showing a schematic structure of the substrate prepared in the substrate preparing step shown in FIG. 2. Either one of the substrate 2 and the semiconductor chip 3 may be prepared first, or both of them may be prepared at the same time.

In the substrate preparing step S1, the prepared substrate 20 includes a plurality of device regions 22 inside its outer frame 21 as shown in FIG. 3. The number of the device regions 22 is not limited to the aspect shown in FIG. 3. However, the substrate 20 in the present embodiment includes, for example, eight device regions 22. The substrate 20 is so-called multi-chip substrate including the plurality of device regions 22.

Each of the device regions 22 corresponds to the substrate 2 shown in FIG. 1. The device region 22 has the upper surface 20a (corresponds to 2a in FIG. 1) and the lower surface 20b (not shown, corresponds to 2b in FIG. 1) opposite to the upper surface 2a. Each member of the substrate 2 explained with reference to FIG. 1 is formed in the device region 22. An upper surface 20a of the device region 22 of the substrate 20 includes the plurality of terminals 2e (see FIG. 1) so as to surround the chip mounting region 21a. The chip mounting region 21a is a designed region for mounting the semiconductor chip 3 shown in FIG. 1 thereon.

As shown in FIG. 3, a cut region 21b is arranged around each of the plurality of device regions 22. The cut region 21b is arranged between the adjacent device regions 22 and between the outer frame 21 and the device region 22 so as to surround an outer edge of each device region 22. The cut region 21b is a designed region for cutting the substrate 20 in a dicing step S8 shown in FIG. 2. The cut region 21b includes a plurality of cut lines extending in an "X" direction and a plurality of cut lines extending in an "Y" direction.

(Mold Bonding Step S3)

Figure 4:
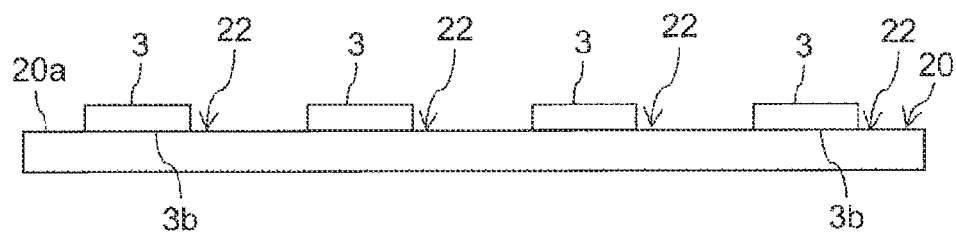
FIG. 4 is a cross-sectional view showing a state in which a semiconductor chip is mounted on the substrate, shown in FIG. 3.

Next, in a mold bonding step "S3" shown in FIG. 2, the semiconductor chip 3 is mounted on the upper surface 20a of the device region 22 of the substrate 20. FIG. 4 is a cross-sectional view showing a state in which the semiconductor chip is mounted on the substrate shown in FIG. 3, that is a cross-sectional view corresponding to a cross-sectional view taken along a line A-A of FIG. 3. Note that illustration of the bonding material 7 shown in FIG. 1 is omitted in FIG. 4 in order to easily see the drawing. However, in each of the plurality of device regions 22 shown in FIG. 4, the bonding material 7 is arranged below the semiconductor chip 3 as shown in FIG. 1.

In the mold bonding step S3, the semiconductor chip 3 is mounted on each of the plurality of device regions 22. The semiconductor chip 3 is bonded and fixed onto the chip mounting region 21a shown in FIG. 3 through the bonding material 7. In the present embodiment, the semiconductor chip 3 is mounted on the substrate 20 by the so-called faceup mounting method of causing the back surface 3b (see FIG. 1) to face the upper surface 20a of the substrate 20. The bonding material 7 contains, for example, the epoxy-based thermal hardening resin. In the mold bonding step S3 in this case, the bonding material 7 is applied onto the chip mounting region 21a first, and then, the back surface 3b of the semiconductor chip 3 is pressed against the chip mounting region 21a. In this manner, the bonding material 7 spreads over the chip mounting region 21a. The semiconductor chip 3 is boned onto the substrate 20 through the bonding material 7. Then, a heating process at about 150° C. is performed by, for example, a heat stage arranged below the substrate 20 to harden the thermal hardening component contained in the bonding material 7, so that the semiconductor chip 3 is fixed to the substrate 20.

(Plasma Cleaning Step S4)

Figure 5:
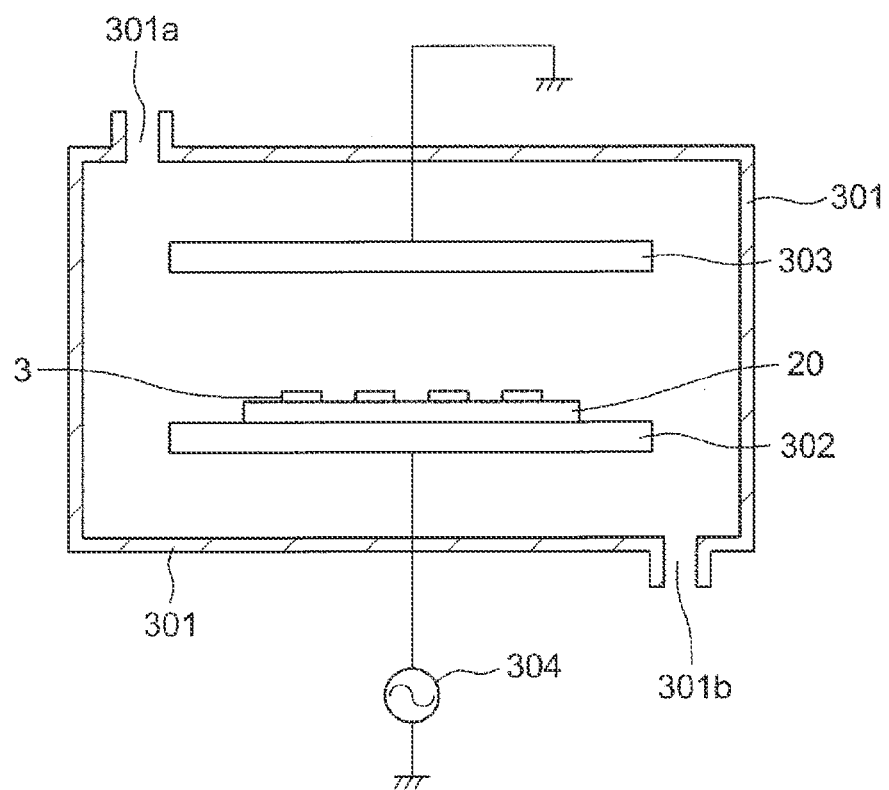
FIG. 5 is a diagram showing one example of a plasma processing apparatus used in a plasma cleaning step shown in FIG. 2.

Next, in a plasma cleaning Step "S4" shown in FIG. 2, for example, a vacuum plasma processing apparatus is used. FIG. 5 is a diagram showing one example of the plasma processing apparatus used in the plasma cleaning step shown in FIG. 2.

The plasma processing apparatus 300 shown in FIG. 5 is a parallel-plate type plasma processing apparatus. As shown in FIG. 5, the plasma processing apparatus 300 includes a chamber 301, and a lower electrode 302 and an upper electrode 303 that are arranged inside the chamber 301 and face each other. The chamber 301 is a processing room that can be vacuum-tightened. The lower electrode 302 is configured so that the substrate 20 can be arranged thereon, and includes a heating mechanism (not illustrated) such as a heater therein. A high frequency power is supplied between the lower electrode 302 and the upper electrode 303 by a high frequency power supply 304 outside the chamber 301. For example, a high frequency power supply 304 is connected to the lower electrode 302, and a ground potential is connected to the upper electrode 303. A frequency of the high frequency power supplied from the high frequency power supply 304 is, for example, 13.56 MHz. The chamber 301 includes a gas supply port 301a and a gas outlet port 301b. Gas for the plasma process is introduced from the gas supply port 301a into the chamber 301, and, at the same time, gas in the chamber 301 is exhausted from the gas outlet port 301b. The chamber 301 is connected through the gas outlet port 301b to a gas discharge unit (not illustrated) such as a vacuum pump. A not-illustrated pressure controller adjusts an exhaust speed of the gas from the gas outlet port 301b or others in accordance with a pressure inside the chamber 301 detected by a pressure sensor or others, and maintains the pressure inside the chamber 301 at a desirable pressure that is lower than a regular atmospheric pressure.

A specific method of performing the plasma cleaning step S4 by using the plasma processing apparatus 300 shown in FIG. 5 will be explained below.

In the plasma cleaning using the plasma processing apparatus 300, first, the substrate 20 on which the semiconductor chip 3 shown in FIG. 5 is mounted is arranged on the lower electrode 302 so that its surface to be plasma-processed faces upward (toward the upper electrode 303). In other words, the substrate 20 is arranged on the lower electrode 302 so that the front surface 3a of the semiconductor chip 3 and the upper surface 20a of the substrate 20 face toward the upper electrode 303.

Then, as the gas for the plasma process, for example, argon (Ar) gas is introduced from the gas supply port 301a into the chamber 301. The pressure inside the chamber 301 is maintained at a predetermined pressure by adjustment of a gas flow rate introduced into the chamber 301 and the exhaust speed of the gas from the chamber 301. In a cited one example, the flow rate of the argon gas introduced into the chamber 301 can be set to about 1 to 20 sccm, and the pressure inside the chamber 301 can be set to about 1 to 50 Pa.

Then, the high frequency power supply 304 supplies the high frequency power to a gap between the lower electrode 302 and the upper electrode 303. In this manner, the plasma is generated between the lower electrode 302 and the upper electrode 303, and the plasma process to the substrate 20 starts. In other words, the process of emitting the plasma to the substrate 20 starts.

This stage forms an electric field that accelerates ions in the plasm because of self bias on the lower electrode 302 or others, and the accelerated plasma or ions in the plasma is emitted to the substrate 20. Therefore, the process of emitting the accelerated plasma or ions to the substrate 20 is an anisotropic plasma process such as a sputter etching process. In the plasm process, the plasma or the ions are accelerated and emitted to the process-receiving surface of the substrate 20, and therefore, not only organic substances but also inorganic substances can be removed by a physical action. By the plasma process, contaminants on the upper surface 20a of the substrate 20 can be removed. In the mold bonding step S3 in this case, the substrate 20 is heated as described above, and therefore, impurities such as an oil component or an organic solvent contained in the solder resist film 2d on the surface of the substrate 20 are released as outgas. Therefore, the upper surface 20a of the substrate 20 is contaminated and adhered with the contaminants. Unless the contaminants are removed, the bonding performance between the wire 5 and the pad 3c on the semiconductor chip 3 and the bonding performance between the wire 5 and the terminal 2e on the substrate 20 are reduced, and the product quality is reduced.

The plasma process to the substrate 20 is performed while the high frequency power is supplied to the gap between the lower electrode 302 and the upper electrode 303 for predetermined time, and then, the supply of the high frequency power to the gap between the lower electrode 302 and the upper electrode 303 stops. In this manner, the plasma process to the substrate 20 ends.

(Wire Bonding Step S5)

Figure 6:
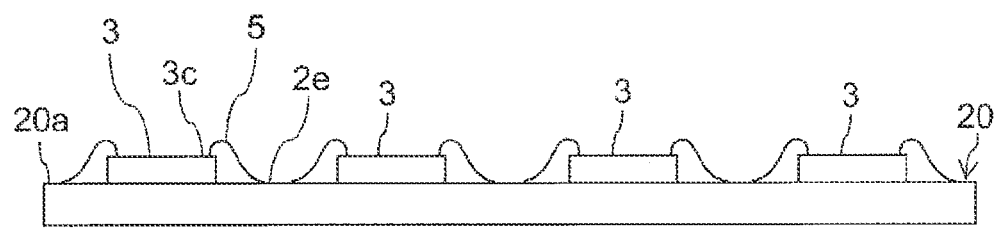
FIG. 6 is a cross-sectional view showing a state in which the semiconductor chip on the substrate shown in FIG. 3 and the substrate are electrically connected to each other by a wire.

Next, in a wire bonding step "S5" shown in FIG. 2, the semiconductor chip 3 and the device region 22 of the substrate 20 are electrically connected to each other as shown in FIG. 6. FIG. 6 is a cross-sectional view showing a state in which the semiconductor chip on the substrate shown in FIG. 3 and the substrate are connected to each other by the wire, that is a cross-sectional view corresponding to the cross-sectional view taken along a line A-A of FIG. 3.

In the wire bonding step S5, the semiconductor chip 3 is electrically connected to the device region 22 of the substrate 20 through the wire 5. More specifically, as shown in FIGS. 1 and 6, one end of the wire 5 is connected to the pad 3c on the front surface 3a of the semiconductor chip 3, and the other end of the same is bonded to the terminal 2e on the upper surface 20a of the substrate 20. In the wire bonding step S5, the substrate 20 is heated at, for example, about 125° C. by the heat stage below the substrate 20. Note that the mold bonding step S3, the plasma cleaning step S4 and the wire bonding step S5 are preferably performed inside an assembly-process clean room.

(Sealing Step S6)

Figure 7:
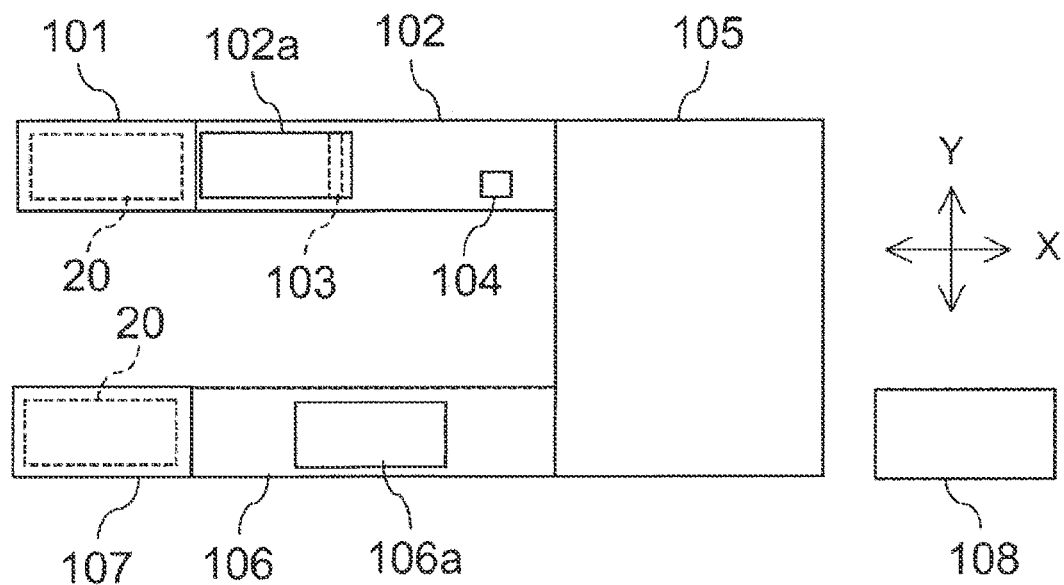
FIG. 7 is a conceptual diagram showing one example of a molding apparatus used in a sealing step shown in FIG. 2.
Figure 8:
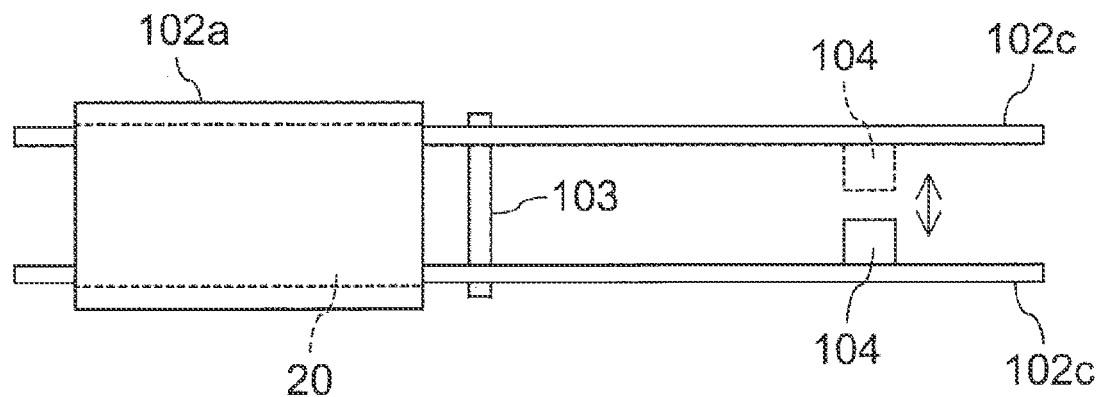
FIG. 8 is a diagram showing a first delivery unit, a plasma generating unit and a recognition camera shown in FIG. 7.
Figure 9:
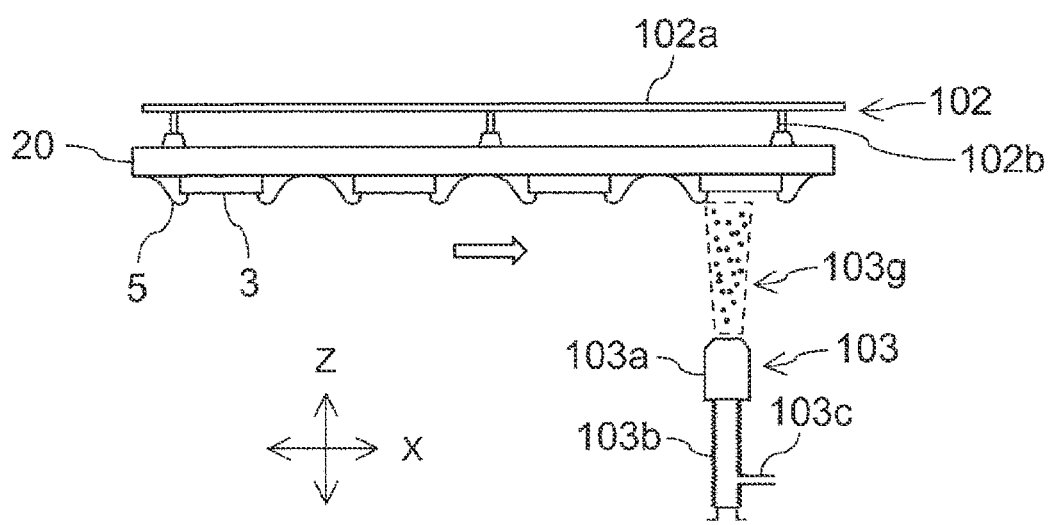
FIG. 9 is a diagram showing layouts of the first delivery unit and the plasma generating unit shown in FIG. 7.
Figure 10:
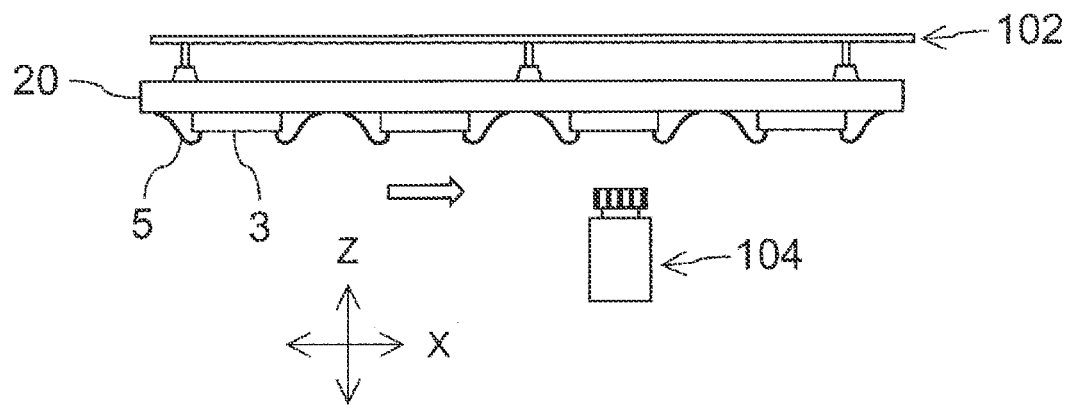
FIG. 10 is a diagram showing layouts of the first delivery unit and the recognition camera shown in FIG. 7.
Figure 11:
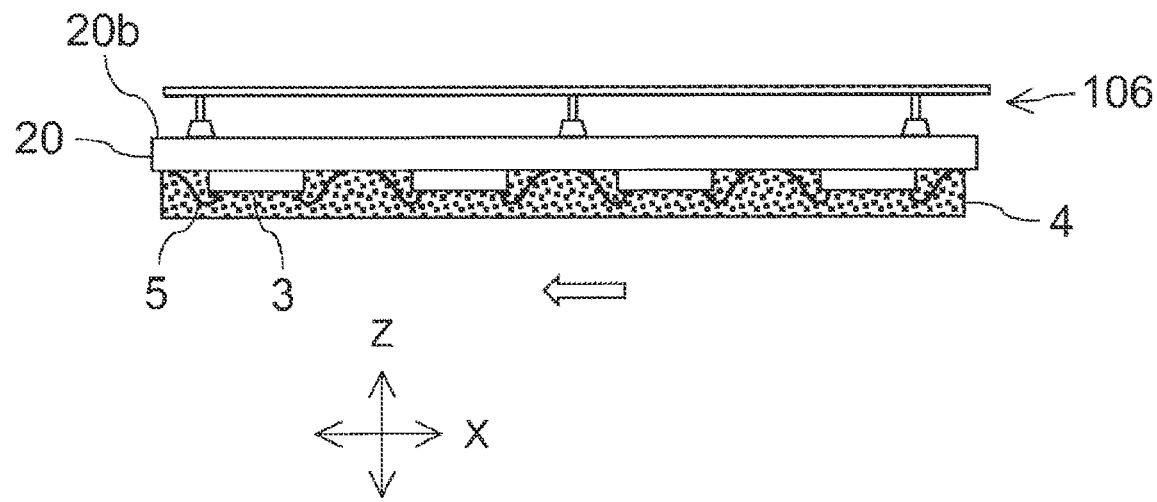
FIG. 11 is a diagram showing a delivery state of the molded substrate by using a second delivery unit shown in FIG. 7.

Next, in a sealing step "S6" shown in FIG. 2, for example, a molding apparatus shown in FIG. 7 is used. FIG. 7 is a schematic view showing one example of the molding apparatus used for the sealing step shown in FIG. 2. FIG. 8 is a diagram showing a first delivery unit, a plasma generating unit and a recognition camera shown in FIG. 7. FIG. 9 is a diagram showing layouts of the first delivery unit and the plasma generating unit shown in FIG. 7. The upper surface of the substrate shown in FIG. 6 faces downward. FIG. 10 is a diagram showing layouts of the first delivery unit and the recognition camera shown in FIG. 7 so that the upper surface of the substrate shown in FIG. 6 faces downward. FIG. 11 is a diagram showing a delivery state of the molded substrate by a second delivery unit in FIG. 7.

As shown in FIG. 7, the molding apparatus 100 serving as a semiconductor manufacturing apparatus includes a loader unit 101, a first delivery unit 102, a plasma generating unit 103, a recognition camera 104, a molding unit 105, a second delivery unit 106, an unloader unit 107 and a controller 108. The loader unit 101, the first delivery unit 102 and the molding unit 105 are arranged along the X direction in this order, and the molding unit 105, the second delivery unit 106 and the unloader unit 107 are arranged along the X direction in this order. Since the upper surface 20a of the substrate 20 is processed while facing downward in the molding unit 105 as described later, the molding apparatus 100 operates while the upper surface 20a of the substrate 20 faces downward even in the delivery at other unit and delivery between the units.

Into the loader unit 101, the substrate 20 on which the semiconductor chip 3 shown in FIG. 6 is mounted and which is connected to the wire 5 is delivered so that the upper surface 20a faces downward.

As shown in FIGS. 8 and 9, the first delivery unit 102 includes a supporting plate 102a, a chuck 102b holding the substrate 20, and a delivery rail 102c used for moving the supporting plate 102a in the X direction. A plurality of the chucks 102b are arranged on the supporting plate 102a. The substrate 20 that is loaded from the loader unit 101 is delivered in the X direction to the molding unit 105 through above the plasma generating unit 103 and the recognition camera 104.

The plasma generating unit 103 is placed to be closer to the loader unit 101 than the recognition camera 104. As shown in FIG. 9, in the delivery of the substrate 20 from the loader unit 101 toward the recognition camera 104 by the first delivery unit 102, the plasma generating unit 103 emits the generated plasma to the delivered substrate 20. Since a range of the plasma emission of the plasma generating unit 103 covers a width (a length in the Y direction) of the substrate 20, the plasma generating unit 103 is fixedly placed.

The recognition camera 104 is placed to be closer to the molding unit 105 than the plasma generating unit 103. As shown in FIG. 10, in the delivery of the substrate 20 from the plasma generating unit 103 toward the molding unit 105 by the first delivery unit 102, the recognition camera 104 captures an image of the substrate 20 (including the semiconductor chip 3 and the wire 5). Since a field of view of the recognition camera 104 covers only a part of the width (the length in the Y direction) of the substrate 20, the recognition camera 104 can be moved in the Y direction by a driving unit (not illustrated).

The molding unit 105 forms the sealing body so as to collectively cover the plurality of semiconductor chips 3 bonded to the plurality of device regions 22 of the substrate 20. The details will be described later.

As shown in FIG. 11, the second delivery unit 106 has the same configuration as that of the first delivery unit, and delivers the substrate 20 that is loaded from the molding unit 105, toward the unloader unit 107.

From the unloader unit 107, the molded substrate 20 shown in FIG. 11 is delivered out of the molding apparatus 100 so that the lower surface 20b faces upward.

The controller 108 includes a memory storing a program (software) for monitoring and controlling an operation of each component of the molding apparatus 100, and a central processor unit (CPU) executing the program stored in the memory.

Details of the sealing step S6 in the present embodiment will be sequentially explained below. As shown in FIG. 2, the sealing step S6 in the present embodiment includes a plasma cleaning step S61, an inspection step S62 and a molding step S63 (a mold preparing step, a substrate holding step, a resin supply step, a substrate dipping step and a resin hardening step). First, as described above, the substrate 20 on which the semiconductor chip 3 shown in FIG. 6 is mounted and which is connected to the wire 5 is delivered to the loader unit 101 so that the upper surface 20a faces downward.

(Plasma Cleaning Step S61)

Next, in the plasma cleaning step S61 shown in FIG. 2, as shown in FIG. 9, the plasma cleaning is performed by using the plasma generating unit 103 while the substrate 20 loaded from the loader unit 101 is delivered.

Figure 12:
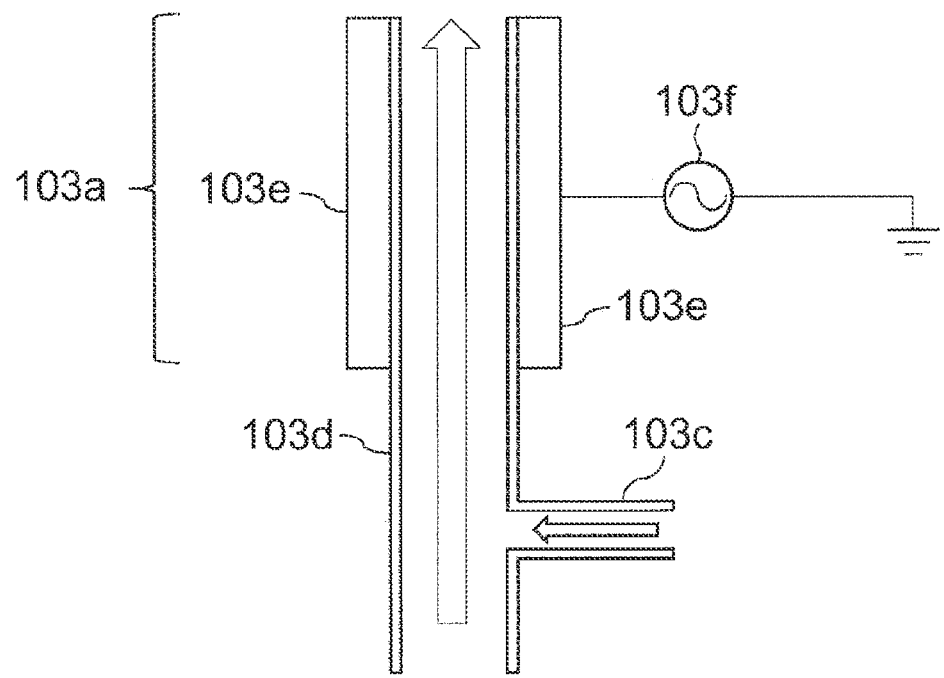
FIG. 12 is a diagram showing an internal structure of the plasma generating unit shown in FIG. 9.

Next, details of the plasma generating unit 103 shown in FIG. 9 will be explained with reference to FIGS. 9 and 12. FIG. 12 is a diagram showing an internal structure of the plasma generating unit shown in FIG. 9.

The plasma generating unit 103 generates the plasma (atmospheric-pressure plasma) under the normal atmosphere without being vacuumed. As shown in FIG. 8, the plasma generating unit 103 is placed below the substrate 20, and emits the plasma directly upward. The plasma generating unit 103 includes a plasma head 103a, a head fix unit 103b and a gas inlet port 103c.

As shown in FIG. 12, the plasma head 103a is made of a gas inlet nozzle 103d and an electrode 103e surrounding its outer circumference, and the electrode 103e is connected to the high-frequency power supply 103f. The gas inlet nozzle 103d is arranged inside the head fix unit 103b, and is connected to the gas inlet port 103c. The gas inlet port 103c is connected to a supply source of the gas for the plasma generation through a pipe and a flow-rate controller (not illustrated). The gas inlet nozzle 103d is connected to a compression air source for spray through a pipe and flow-rate controller (not illustrated).

As a material of the gas inlet nozzle 103d, a low conductive material that is generally called insulator such as glass, quartz glass and alumina is used. However, a metal that is generally called conductor such as stainless steel and aluminum (Al) may be partially used for a portion of the gas inlet nozzle 103d, the portion not being in contact with the electrode 103e inside the plasma head 103a. Each shape of lower and center portions of the gas inlet nozzle 103d is tubular in order to introduce the gas, and its cross section may be circular or rectangular. A shape of an upper portion of the same is rectangular so as to be long in a direction of the width of the substrate in order to spray the gas to the entire width of the substrate, and its length in a shorthand direction is, for example, about 1 mm.

In this configuration, the gas for the plasma generation is introduced from the gas inlet port 103c, is delivered in the gas inlet nozzle 103d by carrier gas of pulse jet introduced from below the gas inlet nozzle 103d, and flows upward. In this case, the pulse jet brings a fast gas flow to a far part in a short time. In the middle of this flow, the delivered gas for the plasma generation is activated by application of the high frequency power to the plasm head 103a by the high-frequency power supply 103f, so that the plasma 103g serving as activate species of the gas for the plasma generation is generated. The frequency of the high frequency power supplied from the high-frequency power supply 103f is, for example, 13.56 MHz. The plasma 103g generated inside the plasma head 103a is jetted by the gas flow, and is emitted to the upper surface 20a of the substrate 20 that has been delivered by the first delivery unit 102. Since the plasma 103g is intermittently jetted by the pulse jet, the plasma is emitted to the single substrate 20 a plurality of times. Time for the pressure reduction is unnecessary because the plasma is generated under the atmospheric pressure. And, an equipment cost can be significantly reduced because large-scale equipment such as a vacuum chamber is unnecessary.

Figure 13:
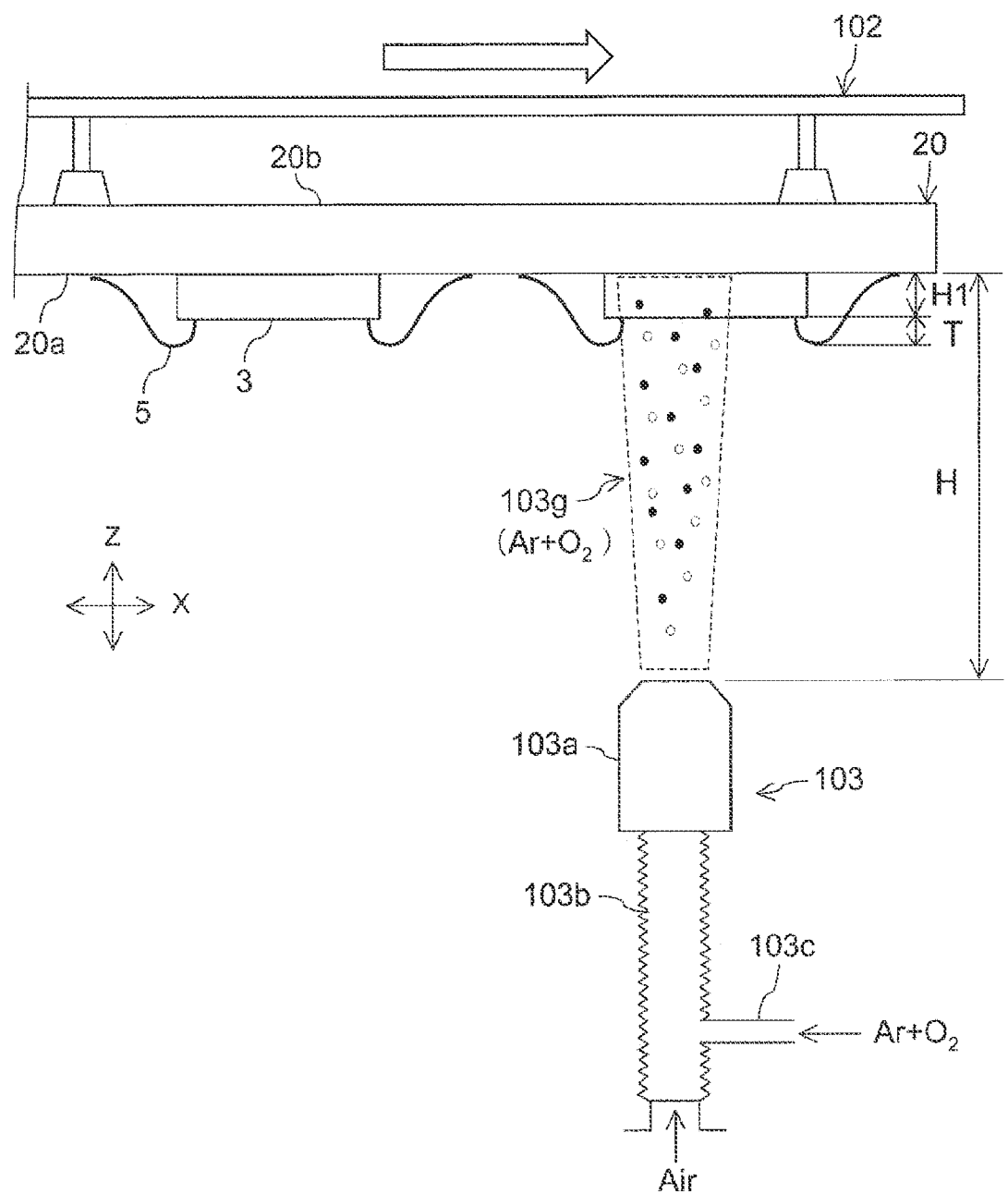
FIG. 13 is a partially-enlarged view of FIG. 9.

Next, the plasma cleaning using the plasma generating unit 103 will be explained with reference to FIG. 13. FIG. 13 is a partially-enlarged view of FIG. 9.

As shown in FIG. 13, in the controller 108, the substrate 20 is delivered in the X direction from left to right in the drawing while the lower surface 20b of the substrate 20 is held by the chuck 102b of the first delivery unit 102, and, at the same time, the plasma 103g is emitted directly upward from the plasma generating unit 103. By the heating in the wire bonding step S5, the impurities such as the oil component, the organic solvent or others contained in the solder resist film 2d on the surface of the substrate 20 are released as the outgas, and the upper surface 20a of the substrate 20 is contaminated and adhered with the contaminants. However, these contaminants can be removed by the plasma emission from the plasma generating unit 103.

In this case, gas such as argon (Ar), oxygen ($O_2$), nitrogen ($N_2$) or others that is mainly effective for removing the organics is preferable as the gas for the plasma generation. Mixture gas of argon (Ar) and oxygen ($O_2$) is more preferable, and a concentration of oxygen is preferably, for example, about 0.5% of that of argon. An upper end of the plasma head 103a of the plasma generating unit 103 is arranged so as to separate by a predetermined distance (H) from the upper surface 20a of the substrate 20. A thickness of the semiconductor chip 3 is assumed to be "T", and a loop height of the wire 5 is assumed to be "H1". For example, "H=7000 μm" is preferable in a case of "T=280 μm" and "H1=150 μm". Plasma emission time is preferably 0.1 second. A delivery speed of the substrate 20 is preferably 10 mm/second.

Figure 15:
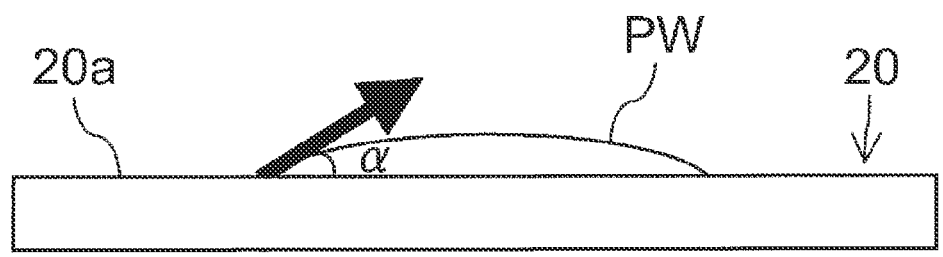
FIG. 15 is a diagram for explaining a contact angle of water.

As a result of evaluation of the bonding performance between the substrate and the resin, the contact angle ($\alpha$) of the pure water "PW" shown in FIG. 15 is needed to be equal to or smaller than 40 degrees. FIG. 15 is a diagram for explaining the contact angle of water. The plasma cleaning in the present embodiment can satisfy the needed contact angle.

Figure 14:
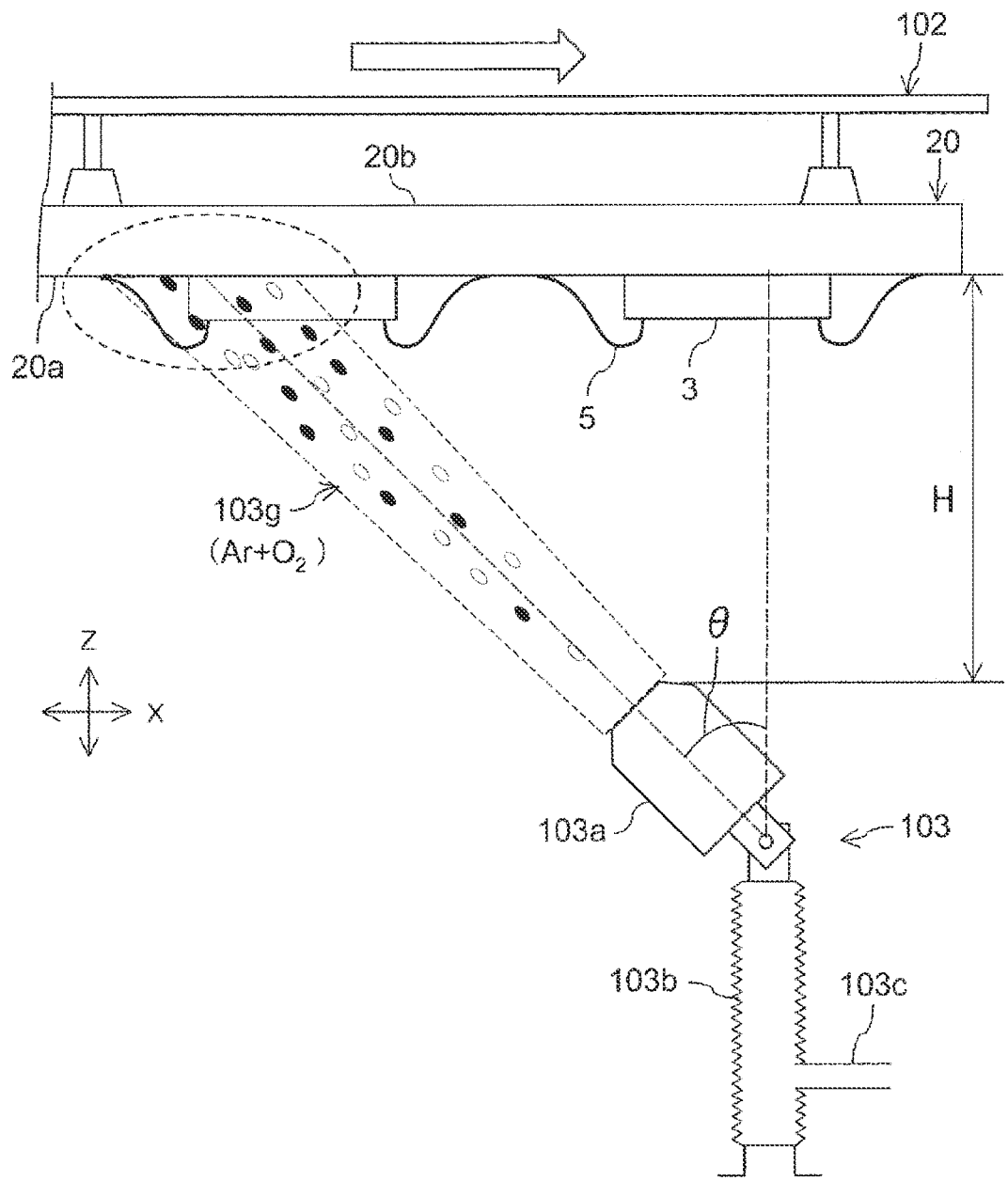
FIG. 14 is a diagram showing an example of change in a direction of plasma emission from a direction shown in FIG. 13.

The direction of the plasma emission may be other than the directly-upward direction shown in FIG. 13. FIG. 14 corresponds to FIG. 12, that is a diagram showing an example of change of the direction of the plasma emission from the direction shown in FIG. 13. For example, as shown in FIG. 14, the plasma may be emitted to tilt by a predetermined angle ($\theta$) toward the delivery direction of the substrate 20 with respect to a vertical line to the upper surface 20a of the substrate 20. The "$\theta$" is preferably, for example, 45 degrees. The tilting of the plasma head 103a with respect to the X-axis direction that is the delivery direction of the substrate 20 can widen the plasma emission range. In this manner, the delivery speed of the substrate 20 can be, for example, 12 mm/second, so that the plasma emission can be faster than that in the directly-upward plasma emission. Alternatively, the plasma head may be tilted toward the same direction as or the opposite direction to the delivery direction of the substrate 20.

(Inspection Step S62)

Next, in the inspection step S62 shown in FIG. 2, as shown in FIG. 10, appearance inspection for the substrate 20 or others is performed using the recognition camera 104 while delivering the plasma-cleaned substrate 20.

As shown in FIG. 10, the recognition camera 104 is placed below the substrate 20. In the controller 108, the substrate 20 is delivered in the X-axis direction from left to right in the drawing while the lower surface 20b of the substrate 20 is held by the chuck 102b of the first delivery unit 102, and, for example, one device region 22 is arranged directly above the recognition camera 104. By the recognition camera 104, images of the substrate 20, the semiconductor chip 3 and the wire 5 in the directly-above positioned device region 22 are captured. Then, the controller 108 moves the recognition camera 104 in the Y-axis direction to capture images of the substrate 20, the semiconductor chip 3 and the wire 5 in a next device region 22. After end of the image capturing of all the device regions on one line in the width direction of the substrate, the controller 108 delivers the substrate 20 to the device regions 22 on a next line by using the first delivery unit 102. By repeating these processes, images of all the device regions of the substrate 20 are captured. On the basis of the images that have been captured by the recognition camera 104, the controller 108 performs inspection such as counting of the number of the semiconductor chips 3 for use in calculation of a resin amount, mounting-failure check for whether the semiconductor chip 3 is mounted on the substrate 20 or not, or inspection for abnormality of a state of the wire 5, foreign substances and others. On the basis of results of this inspection, the controller 108 acquires substrate address information indicating the existence or absence of the semiconductor chip 3 and substrate address information indicating the existence or absence of the abnormality of the state of the wire 5 after the plasma emission or others and a position of the abnormality. In this case the substrate address information is information indicating a corresponding device region of the plurality of device regions 22 of the substrate 20. In this manner, in the dicing step S8, a defective product can be rejected.

At this stage, in a case of a product having a less margin because of a narrow wire distance, the wire is possibly deformed by the flow pressure of the plasma (a blast pressure of the gas) emitted in the plasma cleaning step S61, and the adjacent wires are possibly contact with each other to cause the failure of the wire short-circuit. And, regularly, the molding apparatus is not placed inside the assembly process clean room, and has a potential of the existence of the foreign substances since a cleanliness class is relatively low inside the molding apparatus. The foreign substances are metal foreign substances such as resin burr, scratch dusts of the substrate 20, scratch dusts of aluminum (Al) of an assembly rack inside the loader unit 101 and scratch dusts of cupper (Cu) of the wire 5. The flow rate of the plasma emission is, for example, Mach 1.7 (about 578 m/second), and these foreign substances are possibly scattered and adhered to the substrate 20 or others by the gas blast pressure at the time of plasma emission. By the inspection step S62, the failure and the foreign substances can be detected. Note that the potential of the adhesion of the foreign substances is low if the same apparatus as the vacuum plasma process apparatus used in the plasma cleaning step S4 is used inside the assembly process clean room.

(Molding Step S63)

Figure 16:
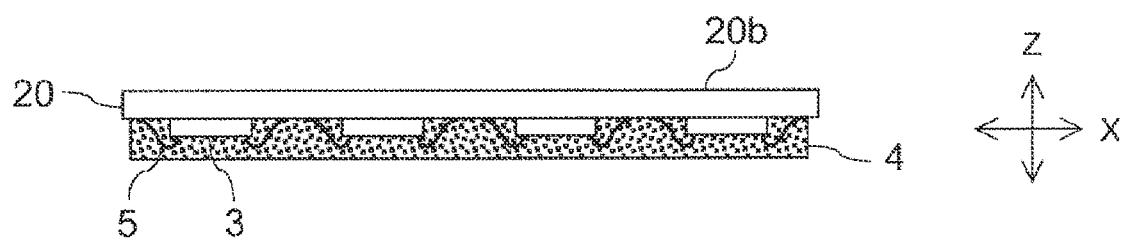
FIG. 16 is a cross-sectional view in a state in which a sealing body is formed in a region of an upper surface of the substrate shown in FIG. 6.
Figure 17:
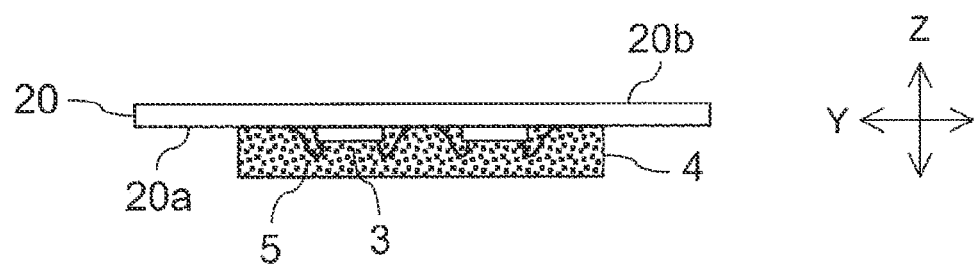
FIG. 17 is a cross-sectional view of a surface that is different from the cross-sectional view shown in FIG. 16.

Next, in a molding step "S63" shown in FIG. 2, the sealing body is formed by sealing of the semiconductor chip 3 shown in FIG. 6 with the resin. The molding step S63 is performed in the molding unit 105 of the molding apparatus 100. FIG. 16 is a cross-sectional view in a state in which the sealing body is formed in the region of the upper surface of the substrate shown in FIG. 6. FIG. 17 is a cross-sectional view of a surface that is different from the cross-sectional view shown in FIG. 16, that is a cross-sectional view corresponding to a cross-sectional view taken along a line B-B of FIG. 3.

As shown in FIGS. 16 and 17, in the present step, the plurality of device regions 22 are collectively covered with the sealing body 4.

Figure 18:
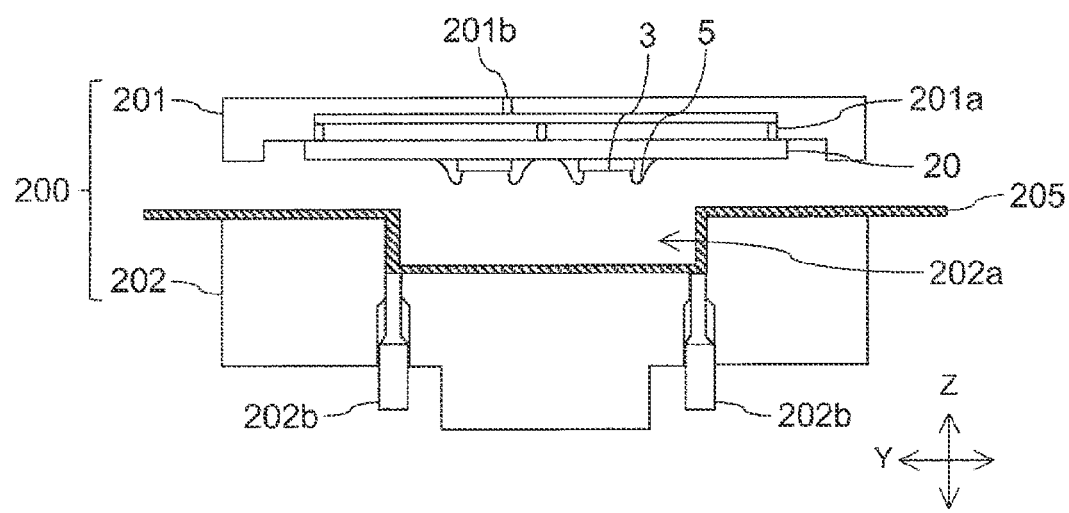
FIG. 18 is a cross-sectional view showing a state in which the substrate is arranged in a forming mold.

In the mold preparing step, a forming mold 200 shown in FIG. 18 is prepared. FIG. 18 is a cross-sectional view in a state in which the substrate is arranged inside the forming mold in a cross-sectional view corresponding to the cross-sectional view taken along the line B-B of FIG. 3. The forming mold 200 includes an upper mold 201 serving as a first mold arranged above the substrate 20 and a lower mold 202 serving as a second mold arranged below the substrate 20. In the molding step S63, the sealing body 4 (see FIG. 17) is formed in a state in which the lower surface 20b of the substrate 20 faces the upper mold 201 while the upper surface 20a of the same faces the lower mold 202. Therefore, the upper mold 201 includes a plurality of sucking holes 201a for folding the lower surface 20b of the substrate 20. Each of the plurality of sucking holes 201a is connected to an air-intake path 201b. The upper mold 201 is structured so that the substrate 20 can be sucked and held at ends of the plurality of sucking holes 201a by sucking gas (such as air) on the ends of the plurality of sucking holes 201a through the air-intake path 201b.

The lower mold 202 includes a cavity 202a that is a mold for forming the sealing body 4. The cavity 202a is covered with a mold release sheet 205. The mold release sheet 205 is, for example, a thin film made of resin. Since the mold release sheet 205 is arranged between the cavity 202a and the sealing body 4 (see FIG. 17), detachability between the lower mold 202 and the sealing body 4 can be improved after the formation of the sealing body 4. Since the sealing resin can be prevented from adhering to the lower mold 202, a cleaning work for the lower mold 202 can be eliminated or shortened. The lower mold 202 includes an ejector pin 202b for taking the sealing body 4 out of the cavity 202a.

In the substrate holding step after the mold preparing step, as shown in FIG. 18, the substrate 20 is arranged between the upper mold 201 and the lower mold 202. Since the lower surface 20b of the substrate 20 is sucked by the plurality of sucking holes 201a, the upper mold 201 holds the substrate 20 so that the upper surface 20a of the substrate 20 faces downward.

In the substrate holding step, alignment is performed by control for a positional relation between the forming mold 200 and the substrate 20 in a planar view. In the substrate holding step, the alignment between the upper mold 201 and the substrate 20 is performed so that a concave portion (not illustrated) at an end of the substrate 20 or a hole (not illustrated) at its circumference is arranged so as to overlap a positioning pin (not illustrated) of the upper mold 201. The positional relation between the upper mold 201 and the lower mold 202 is previously adjusted, and therefore, the alignment between the upper mold 201 and the substrate 20 consequently completes the alignment between the lower mold 202 and the substrate 20.

Figure 19:
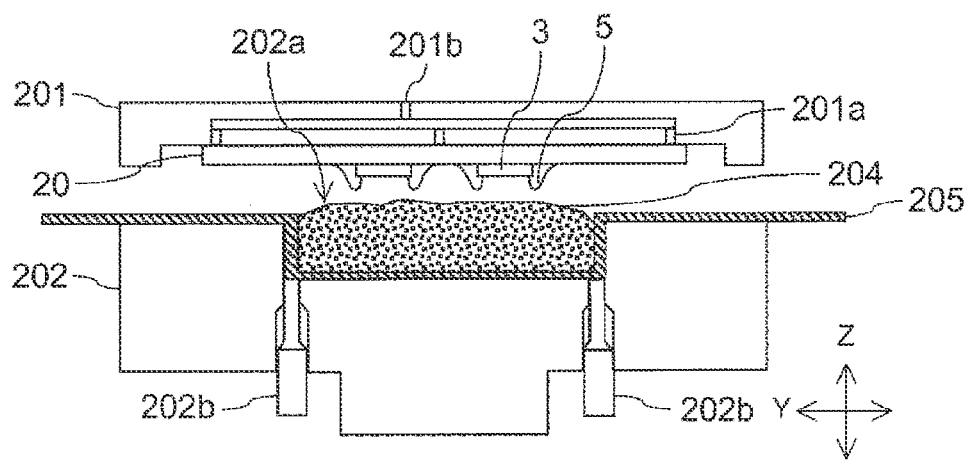
FIG. 19 is a cross-sectional view showing a state in which a resin is supplied into and softened in a cavity of a lower mold shown in FIG. 18.

In the resin supply step after the mold preparing step, as shown in FIG. 19, a resin 204 is supplied into the cavity 202a of the lower mold 202. FIG. 19 is a cross-sectional view showing a state in which the resin 204 is supplied into the cavity of the lower mold shown in FIG. 18 and softened. More specifically, the cavity 202a is covered with the mold release sheet 205, and the resin 204 is supplied onto the mold release sheet 205. The resin 204 is a raw material resin of the sealing body 4 shown in FIGS. 16 and 17. The resin 204 contains not only the thermal hardening resin but also materials such as filler particles for adjusting a linear coefficient of expansion of the sealing body 4, carbon black for blacking a color of the sealing body 4 and others. A compression molding method is adopted to the molding step S63 in the present embodiment, the method being for the sealing by dipping the plurality of semiconductor chips 3 and the plurality of wires 5 into the softened resin 204 inside the cavity 202a.

The compression molding method is distinguished from a transfer molding method of injecting the softened resin into a space sandwiched by the cavity 202a and the substrate 20 under a pressure. In the compression molding method, flowage of the resin 204 in the molding step is small so as to be practically more negligible than that of the transfer molding method. Therefore, this method is preferable in that deformation of a component, particularly, the wire 5 on the substrate 20 due to the flowage of the resin 204 can be suppressed. The compression molding method is suitable for molding of a large substrate. The transfer molding method is applicable to molding of a small substrate.

As the material of the resin 204, note that the same material as that of the resin used for the transfer molding method can be used. In the transfer molding method, a pellet of the raw material resin is softened in a container that is called a pot, and then, is supplied into the cavity by a plunging pressure. On the other hand, in the compression molding method, the granular-formed raw material resin is placed inside the cavity 202a, and then, is softened inside the cavity 202a.

Note that a step order of the substrate holding step and the resin supply step is not particularly limited. Although the present specification explains the substrate holding step as an earlier step, the resin supply step may be executed as the earlier step.

Alternatively, for example, after the granular-formed raw material resin is supplied into the cavity 202a, the substrate holding step may be executed, and then, the raw material resin may be heated to obtain the softened resin 204. This case can more shorten time for keeping a temperature of the resin 204 than the case of executing the resin supply step as the earlier step. The substrate holding step can be executed while the lower mold 202 is not heated.

Figure 20:
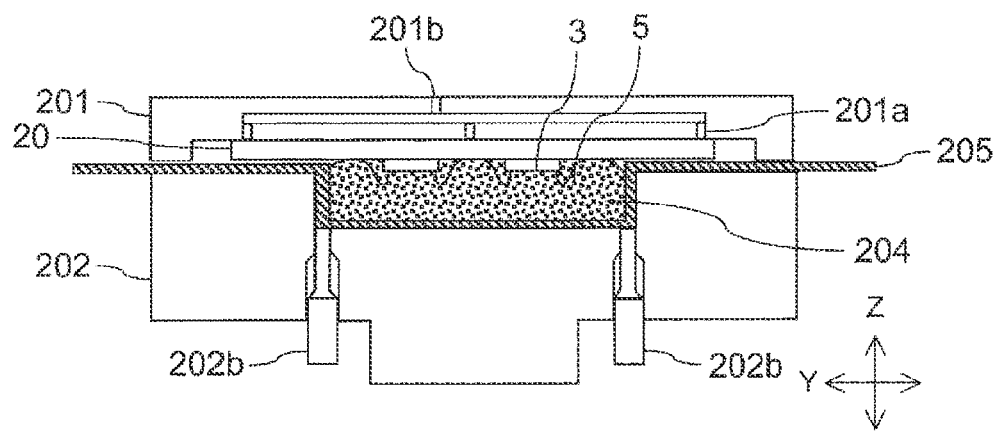
FIG. 20 is a cross-sectional view showing a state in which upper and lower molds shown in FIG. 19 are close to each other.

In the substrate dipping step after the substrate holding step and the resin supply step, as shown in FIG. 20, the semiconductor chip 3 is dipped into the cavity 202a to seal the semiconductor chip 3. FIG. 20 is a cross-sectional view showing a state in which the upper mold and the lower mold show in FIG. 19 are close to each other.

In the substrate dipping step, the upper mold 201 and the lower mold 202 are made close to each other so that the semiconductor chip 3 and the upper surface 20a of the substrate 20 are covered with the resin 204 in the cavity 202a. As shown in FIG. 20, in this step, each of the semiconductor chip 3 and the plurality of wires 5 is sealed with the resin 204.

In the resin hardening step after the substrate dipping step, the resin 204 shown in FIG. 20 is heated to harden the thermal hardening resin contained in the resin 204. By this step, the sealing body 4 shown in FIGS. 16 and 17 is obtained.

Figure 21:
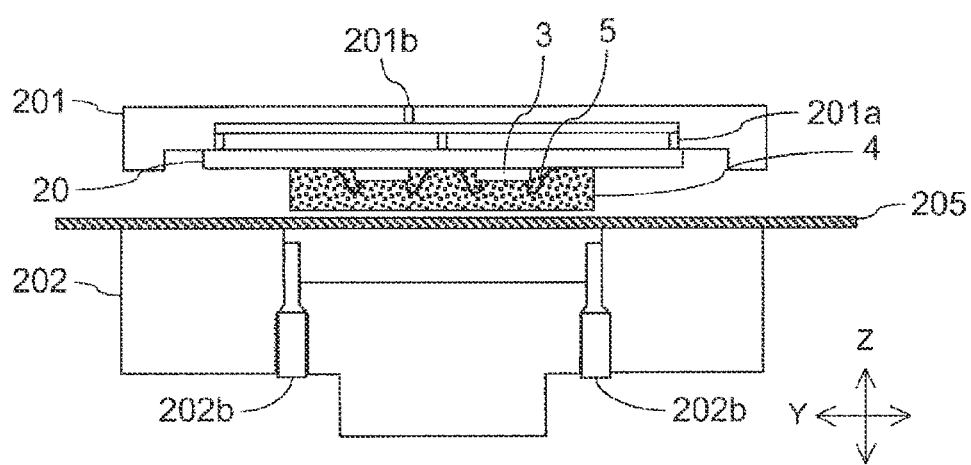
FIG. 21 is a cross-sectional view showing a state in which the upper and lower molds shown in FIG. 20 are far from each other.

As shown in FIG. 20, the mold release sheet 205 is arranged between the resin 204 and the cavity 202a. In this manner, as shown in FIG. 21, when the upper mold 201 and the lower mold 202 are made far from each other while the ejector pin 202b is pushed up, the sealing body 4 is released from the cavity 202a, and the mold release sheet 205 is easily peeled off from the resin 204 (or the sealing body 4 shown in FIG. 15). FIG. 21 is a cross-sectional view in a state in which the upper mold and the lower mold shown in FIG. 20 are far from each other. Meanwhile, the substrate 20 and the upper mold 201 are held by the suction force of the plurality of sucking holes 201a shown in FIG. 21. Therefore, the substrate 20 and the upper mold 201 are easily detached from each other by stop of the suction of the sucking holes 201a.

At the end, the molded substrate 20 is delivered out of the molding apparatus 100 through the unloader unit 107 so that the lower surface 20b faces upward. Then, a mold appearance inspection and a wire X-ray inspection are executed.

(Ball Mounting Step S7)

Next, in a ball mounting step "S7" shown in FIG. 2, the plurality of solder balls 6 are bonded to the plurality of lands 2f (see FIG. 1) formed on the lower surface 20b or the substrate 20. The present step bonds the plurality of solder balls 6 and lands 2f to each other by arranging and heating the solder balls 6 on the plurality of lands 2f, respectively, exposed form the lower surface 20b or the substrate 20. By the present step, the plurality of solder balls 6 are electrically connected to the semiconductor chip 3 through the substrate 20. However, the technique explained in the present embodiment is not only applied to so-called BGA (Ball Grid Array) semiconductor device with the bonded solder balls 6. For example, as a modification example of the present embodiment, the technique is applicable to a semiconductor device to be shipped in a state in which the lands 2f are exposed without the formation of the solder balls 6 or a state in which a solder paste is applied to the lands 2f so as to be thinner than those of the solder balls 6. This semiconductor device is so-called LGA (Land Grid Array) semiconductor device.

(Dicing Step S8)

Next, in a dicing step "S8" shown in FIG. 2, the plurality of device regions 22 are diced to obtain each of them by cutting the substrate 20 and the sealing body 4 along a cut region 21b arranged between them and surrounding each of the plurality of device regions 22 shown in FIG. 3. More specifically, the dicing step S8 cuts the substrate 20 by using a cutting/grinding jig that is so-called dicing blade and cutting/grinding the cut region 21b of the substrate 20. Therefore, the cut region 21b has a width of about several hundreds of μm in a direction crossing an extending direction.

By each of the above-described steps, the semiconductor device 1 explained with reference to FIG. 1 is obtained. Then, the necessary inspections and tests such as the appearance inspection and the electrical test are performed to the semiconductor device 1, and the semiconductor device 1 is shipped or mounted on amounting board not illustrated.

In the foregoing, the present invention made by the present inventors has been concretely described on the basis of the embodiments. However, the present invention is not limited to the foregoing embodiments, and it is needless to say that various modifications can be made.

For example, the embodiments have been explained in the example in which, in the state of the arrangement of the plasma generating unit 103 and the recognition camera 104 below the substrate 20, the plasma is emitted upward while the recognition camera faces upward and captures the images. However, the embodiments are not limited to this example, and, in a state of arrangement of the plasma generating unit 103 and the recognition camera 104 above the substrate, the plasma may be emitted downward while the recognition camera may face downward and capture the images.

Also, the embodiments have been explained in the example of the compression molding method. However, the embodiments are also applicable to the transfer molding method. In this case, in the state of arrangement of the plasma generating unit 103 and the recognition camera 104 above the substrate, the plasma is emitted downward while the recognition camera faces downward and captures the images.

The embodiments have been explained in the example in which the vacuum plasma process apparatus is used in the plasma cleaning step S4. However, atmospheric-pressure plasma emission may be applicable to the plasma cleaning step S61. In this case, in the state of arrangement of the plasma generating unit above the substrate, the plasma is emitted downward.

The embodiments have been explained in the example of the usage of the wiring board as the substrate. However, a lead-frame board or others is also applicable.

What is claimed is:

1. A method of manufacturing a semiconductor device, the method comprising the steps of:
    (a) preparing a substrate including a plurality of device regions each including a plurality of terminals formed on a main surface and a semiconductor chip mounted on the main surface and electrically connected to the terminal by a wire;
    (b) after the step (a), delivering the substrate while emitting plasma generated in atmospheric pressure to a region of the main surface of the substrate;
    (c) after the step (b), delivering the substrate while capturing an image of the region of the main surface of the substrate; and
    (d) after the step (c), forming a sealing body by sealing the semiconductor chip and the wire with a resin,
    wherein, in the step (b), the substrate is delivered in a state in which the main surface of the substrate faces downward while the plasma generated in atmospheric pressure is emitted from below to the region of the main surface of the substrate,
    wherein, in the step (c), the substrate is delivered in a state in which the main surface of the substrate faces downward while an image of the region of the main surface of the substrate is captured from below, and
    wherein, in the step (d), the sealing body is formed by sealing the semiconductor chip and the wire with the resin in the state in which the main surface of the substrate faces downward.

2. The method of manufacturing the semiconductor device according to claim 1, wherein, before the step (a), the substrate is heated at a temperature or higher at which impurities of an oil component or organic solvent contained in a solder resist on a surface of the substrate are released as gas.

3. The method of manufacturing the semiconductor device according to claim 1, wherein, in the step (b), the plasma is generated by supplying mixture gas of argon and oxygen.

4. The method of manufacturing the semiconductor device according to claim 1, wherein, in the step (b), the plasma is emitted to the substrate a plurality of times so that the plasma is emitted for 0.1 second per one emission.

5. The method of manufacturing the semiconductor device according to claim 1, wherein, in the step (b), the plasma is vertically emitted to the main surface of the substrate.

6. The method of manufacturing the semiconductor device according to claim 1, wherein, in the step (b), the plasma is obliquely emitted to the main surface of the substrate.

7. The method of manufacturing the semiconductor device according to claim 1, wherein, in the step (c), a state of the wire and existence or absence of foreign substances is inspected on a basis of the captured image.

8. The method of manufacturing the semiconductor device according to claim 7, wherein, in the step (c), on the basis of the captured image, the number of the semiconductor chips for use in calculation of a resin amount is counted, and a mounting-failure check for whether the semiconductor chip is mounted on the substrate or not is performed.

9. The method of manufacturing the semiconductor device according to claim 8, wherein the step (d) includes the steps of:
    (d1) arranging the substrate in a portion between a first mold and a second mold including a cavity arranged at a position facing the first mold and causing the first mold to hold the substrate in a state in which the main surface of the substrate faces downward;
    (d2) after the step (d1), supplying a resin into the cavity of the second mold;
    (d3) after the steps (d1) and (d2), making the first mold and the second mold close to each other so that the semiconductor chip, the wire and the main surface of the substrate are covered with the resin inside the cavity; and
    (d4) forming the sealing body by hardening the resin.

10. A method of manufacturing a semiconductor device, the method comprising the steps of:
    loading a substrate into a semiconductor manufacturing apparatus including: a loader unit into which the substrate is loaded, the substrate including a plurality of device regions each including a plurality of terminals formed on a main surface and a semiconductor chip mounted on the main surface and electrically connected to the terminal by a wire; a substrate delivery unit delivering the substrate; a plasma generating unit arranged so as to face the main surface of the substrate and generating plasma in atmosphere; a recognition camera arranged so as to face the main surface of the substrate and capturing images of the substrate, the semiconductor chip and the wire; and a molding unit forming a sealing body by sealing the semiconductor chip and the wire with a resin;
    delivering the substrate from the loader unit to the recognition camera by using the substrate delivery unit in a state in which the main surface of the substrate faces downward, and at the same time, emitting the plasma to the region of the main surface of the substrate by using the plasma generating unit;
    delivering the substrate from the plasma generating unit to the molding unit by using the substrate delivery unit in the state in which the main surface of the substrate faces downward, and at the same time, capturing an image of the region of the main surface of the substrate by using the recognition camera; and
    forming a sealing body by sealing the semiconductor chip and the wire with a resin in the state in which the main surface of the substrate faces downward.

* * * * *